US012501780B2

(12) United States Patent
Cui

(10) Patent No.: US 12,501,780 B2
(45) Date of Patent: Dec. 16, 2025

(54) ARRAY SUBSTRATE, PREPARATION METHOD, DISPLAY PANEL, AND DISPLAY DEVICE

(71) Applicant: BOE Technology Group Co., Ltd., Beijing (CN)

(72) Inventor: Ying Cui, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 995 days.

(21) Appl. No.: 17/597,758

(22) PCT Filed: Apr. 9, 2021

(86) PCT No.: PCT/CN2021/086117
§ 371 (c)(1),
(2) Date: Jan. 21, 2022

(87) PCT Pub. No.: WO2021/238431
PCT Pub. Date: Dec. 2, 2021

(65) Prior Publication Data
US 2022/0262879 A1    Aug. 18, 2022

(30) Foreign Application Priority Data
May 29, 2020   (CN) .......................... 202010471555.X

(51) Int. Cl.
*H10K 59/122* (2023.01)
*H10K 59/35* (2023.01)
(52) U.S. Cl.
CPC ........... *H10K 59/122* (2023.02); *H10K 59/35* (2023.02)

(58) Field of Classification Search
CPC .............................. H10K 59/122; H10K 59/35
See application file for complete search history.

(56) References Cited

U.S. PATENT DOCUMENTS 11,665,932 B2 * 5/2023 Kim ..................... H10K 59/126
257/40
2004/0119066 A1  6/2004 Han et al.
(Continued)

FOREIGN PATENT DOCUMENTS

CN       101689559 A    3/2010
CN       103779380 A    5/2014
(Continued)

OTHER PUBLICATIONS

Chinese Office Action, mailed Mar. 1, 2022, from China Patent Application No. 202010471555.X.
(Continued)

*Primary Examiner* — Benjamin Tzu-Hung Liu
(74) *Attorney, Agent, or Firm* — Workman Nydegger

(57) ABSTRACT

Disclosed are an array substrate, a preparation method, a display panel, and a display device. A pixel limiting layer includes a first limiting sublayer and a second limiting sublayer which contact each other, and a first height of the first limiting sublayer in a direction perpendicular to a plane where a base substrate is located is greater than a second height of the second limiting sublayer in the direction perpendicular to the plane where the base substrate is located. Thus, when light emitting layers are formed in pixel openings by an ink jet printing process, light emitting layers having different colors can be spaced apart by the first limiting sublayer.

11 Claims, 7 Drawing Sheets

(56) References Cited

U.S. PATENT DOCUMENTS

| | | | |
|---|---|---|---|
| 2007/0200488 A1* | 8/2007 | Ito | F21K 2/06 |
| | | | 313/503 |
| 2008/0036374 A1 | 2/2008 | Okano | |
| 2015/0123150 A1* | 5/2015 | Adachi | H10K 59/351 |
| | | | 257/88 |
| 2019/0114459 A1 | 4/2019 | Ma et al. | |
| 2023/0133156 A1 | 5/2023 | Hou et al. | |

FOREIGN PATENT DOCUMENTS

| | | |
|---|---|---|
| CN | 107665904 A | 2/2018 |
| CN | 107731871 A | 2/2018 |
| CN | 108922469 A | 11/2018 |
| CN | 109801939 A | 5/2019 |
| CN | 109830507 A | 5/2019 |
| CN | 111584605 A | 8/2020 |
| CN | 111599849 A | 8/2020 |
| JP | 2007234232 A | 9/2007 |
| JP | 2013206629 A | 10/2013 |
| JP | 2015090814 A | 5/2015 |
| JP | 2015207526 A | 11/2015 |
| JP | 20179884 A | 1/2017 |
| KR | 20150075135 A | 7/2015 |
| KR | 20190058608 A | 5/2019 |
| KR | 20200041689 A | 4/2020 |
| WO | 2006054421 A1 | 5/2006 |
| WO | 2015182096 A1 | 12/2015 |
| WO | 2021/174983 A1 | 9/2021 |

OTHER PUBLICATIONS

International Search Report, mailed Jul. 14, 2021, from PCT/CN2021/086117.

Japanese Office Action, mailed Feb. 25, 2025, for Japan Patent Application No. 2022-530200, 14 pages.

European Extended Search Report, mailed Apr. 12, 2023, from European Pat. App. No. 21814086.1, Apr. 9, 2021.

Korean First Office Action, mailed Dec. 27, 2024, from KR App. No. 10-2022-7017519, 24 pages.

Japanese Office Action, mailed Jun. 24, 2025, from Japanese Patent Application No. 2022-530200, 10 pages.

\* cited by examiner

ARRAY SUBSTRATE, PREPARATION METHOD, DISPLAY PANEL, AND DISPLAY DEVICE

CROSS-REFERENCE TO RELATED APPLICATIONS

The present application is a US National Stage of International Application No. PCT/CN2021/086117, filed on Apr. 9, 2021, which claims priority to the Chinese Patent Application No. 202010471555.X, filed to China Patent Office on May 29, 2020, and entitled "ARRAY SUBSTRATE, PREPARATION METHOD, DISPLAY PANEL, AND DISPLAY DEVICE", the entire content of which is incorporated herein by reference.

FIELD

The present disclosure relates to the technical field of display, in particular to an array substrate, a preparation method, a display panel and a display apparatus.

BACKGROUND

An organic light emitting diode (OLED) has the advantages of being self-luminous, fast in response, wide in viewing angle, high in light emitting efficiency, bright in color, light, and thin. Therefore, a display technology utilizing the OLED has become an important technology.

SUMMARY

An array substrate provided by embodiments of the present disclosure includes:
  a base substrate;
  a first electrode layer, located on the base substrate, and including a plurality of first electrodes spaced apart from each other;
  a pixel defining layer, located on one side, facing away from the base substrate, of the first electrode layer; where the pixel defining layer includes: first sub defining layers and second sub defining layers which are in contact with each other; the first sub defining layers and the second sub defining layers define a plurality of pixel openings; and an orthographic projection of one of the pixel openings on the base substrate is located in an orthographic projection of one of the first electrodes on the base substrate; and
  a light emitting functional layer, located on one side, facing away from the base substrate, of the pixel defining layer; where the light emitting functional layer includes a plurality of light emitting layers with different colors; the light emitting layers are located in the pixel openings; light emitting layers in at least two adjacent pixel openings along a first direction are the same in color; light emitting layers in at least two adjacent pixel openings along a second direction are different in color; and the first direction is different from the second direction;
  where each first sub defining layer is located between two adjacent pixel openings provided with light emitting layers with different colors, and each first sub defining layer has a first height in a direction perpendicular to a plane where the base substrate is located;
  each second sub defining layer is located between two adjacent pixel openings provided with light emitting layers with the same color, and each second sub defining layer has a second height in the direction perpendicular to the plane where the base substrate is located; and
  the first height is greater than the second height.

Optionally, in the embodiments of the present disclosure, each pixel opening has a long edge and a short edge, and an orthographic projection of each second sub defining layer on the base substrate is close to orthographic projections of short edges of the two adjacent pixel openings provided with the light emitting layers with the same color on the base substrate.

Optionally, in the embodiments of the present disclosure, an orthographic projection of each first sub defining layer on the base substrate bends and extends roughly along the first direction, and each first sub defining layer is a continuous broken-line structure; and
  in the second direction, a plurality of second sub defining layers are arranged between two adjacent first sub defining layers, and the plurality of second sub defining layers located between the two adjacent first sub defining layers are arranged at intervals.

Optionally, in the embodiments of the present disclosure, an orthographic projection of each first sub defining layer on the base substrate extends roughly in the first direction, and each first sub defining layer is a continuous straight-line structure; and
  in the second direction, a plurality of second sub defining layers are arranged between two adjacent first sub defining layers, and the plurality of second sub defining layers located between the two adjacent first sub defining layers are arranged at intervals.

Optionally, in the embodiments of the present disclosure, the array substrate includes a plurality of repetitive units, the plurality of repetitive units are arranged into a plurality of repetitive unit sets along the second direction, and the plurality of repetitive unit sets are arranged along the first direction; and
  each repetitive unit includes a plurality of pixel openings arranged in sequence along the second direction, where light emitting layers of a same repetitive unit set are different in color.

Optionally, in the embodiments of the present disclosure, an included angle between an extending direction of the long edge of each pixel opening and the second direction is larger than 0 degree and smaller than 90 degrees.

Optionally, in the embodiments of the present disclosure, in the same repetitive unit, each pixel opening has a first short edge and a second short edge opposite to each other; and for two pixel openings arranged in sequence along the first direction, the first short edge of a first pixel opening in the two pixel openings, the second short edge of a second pixel opening in the two pixel openings, and the second sub defining layer arranged between the two pixel openings have an overlapping region in the first direction.

Optionally, in the embodiments of the present disclosure, the first short edge of the first pixel opening is located at one end of the second sub defining layer arranged between the two pixel openings, and the second short edge of the second pixel opening is located at the other end of the second sub defining layer arranged between the two pixel openings.

Optionally, in the embodiments of the present disclosure, an extending direction of the long edge of each pixel opening is roughly the same as the first direction; and
  the orthographic projection of each second sub defining layer on the base substrate is located between orthographic projections of the short edges of the two adjacent pixel openings provided with the light emitting layers with the same color on the base substrate.

Optionally, in the embodiments of the present disclosure, a width of each second sub defining layer in the second direction is roughly equal to a width of the orthographic projection of the short edge of the adjacent pixel opening on the base substrate.

Optionally, in the embodiments of the present disclosure, the light emitting functional layer includes a first color light emitting layer, a second color light emitting layer and a third color light emitting layer;

the plurality of pixel openings include a first pixel opening, a second pixel opening and a third pixel opening, where the first color light emitting layer is located in the first pixel opening, the second color light emitting layer is located in the second pixel opening, and the third color light emitting layer is located in the third pixel opening; and each repetitive unit includes a first pixel opening, a second pixel opening and a third pixel opening arranged in sequence along the second direction.

Embodiments of the present disclosure further provide a preparation method of an array substrate, including:

forming, on a base substrate, a pattern of a plurality of first electrodes spaced apart from each other in a first electrode layer;

forming second sub defining layers on the base substrate with the first electrode layer formed, where each second sub defining layer has a second height in a direction perpendicular to a plane where the base substrate is located;

forming first sub defining layers on the base substrate with the second sub defining layer formed, where each first sub defining layer has a first height in the direction perpendicular to the plane where the base substrate is located, the first height is greater than the second height, the first sub defining layers and the second sub defining layers are in contact with each other to define a plurality of pixel openings, and an orthographic projection of one of the pixel openings on the base substrate is located in an orthographic projection of one of the first electrodes on the base substrate; and forming a light emitting functional layer in the pixel openings by adopting an ink jet printing process, where the light emitting functional layer includes a plurality of light emitting layers with different colors, the light emitting layers are located in the pixel openings, light emitting layers in at least two adjacent pixel openings along a first direction are the same in color, light emitting layers in at least two adjacent pixel openings along a second direction are different in color, and the first direction is different from the second direction;

each second sub defining layer is located between two adjacent pixel openings provided with light emitting layers with the same color, and each first sub defining layer is located between two adjacent pixel openings provided with light emitting layers with different colors.

Embodiments of the present disclosure further provide a display panel, including the above array substrate.

Embodiments of the present disclosure further provide a display apparatus, including the above display panel.

DETAILED DESCRIPTION OF THE EMBODIMENTS

Figure 1:
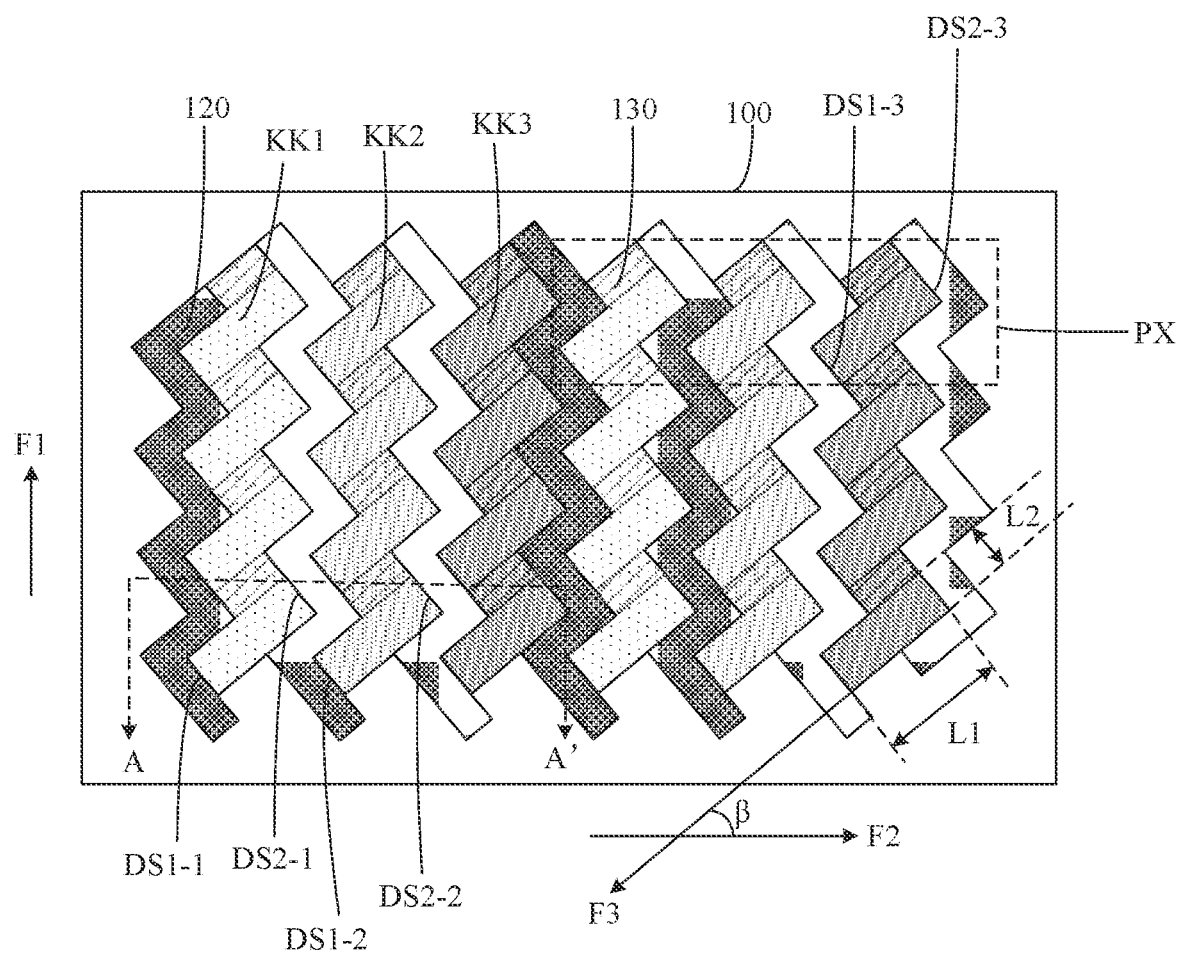
FIG. 1 is a schematic top view of some array substrates in embodiments of the present disclosure.

In order to make the objectives, technical solutions, and advantages of embodiments of the present disclosure clearer, the technical solutions of the embodiments of the present disclosure will be described clearly and completely below in conjunction with the accompanying drawings of the embodiments of the present disclosure. Obviously, the described embodiments are part of the embodiments of the present disclosure, rather than all of the embodiments. Under the condition of no conflict, the embodiments in the present disclosure and features in the embodiments can be combined with each other. Based on the described embodiments of the present disclosure, all other embodiments obtained by those of ordinary skill in the art without creative labor are within the protection scope of the present disclosure.

Unless otherwise defined, technical terms or scientific terms used in the present disclosure shall have the usual meanings understood by those of ordinary skill in the art to which the present disclosure belongs. "First", "second" and similar words used in the present disclosure do not indicate any order, quantity or importance, but are only configured to distinguish different components. "Include" or "comprise" and other similar words mean that an element or item appearing before the word includes an element or item listed after the word and its equivalents, but does not exclude other elements or items. "Connected", "linked" and similar words are not limited to physical or mechanical connections, but may include electrical connections, whether direct or indirect.

It should be noted that size and shape of each figure in the drawings do not reflect the true ratio, and the purpose is only to illustrate the present disclosure. The same or similar reference numerals indicate the same or similar elements or elements with the same or similar functions throughout.

When an organic light emitting diode is prepared, methods for forming a light emitting layer thereof include: 1, a vacuum evaporation method, applicable to small organic molecules, where the method has the characteristics that no solvent is needed in formation of the light emitting layer, and thin films are uniform in thickness, but equipment investment is large, material utilization rate is low and the method is not suitable for production of large-size products; and 2, a solution of an organic light emitting material is adopted for preparing the light emitting layer, including spin-coating, ink jet printing, etc., which are applicable to polymer materials and soluble smaller molecules; and the method has the characteristics that the equipment cost is low and have prominent advantages in large-scale large-size product production. When the light emitting layer is formed by an ink jet printing mode, a pixel defining layer needs to be manufactured on a base substrate 100 in advance, so as to limit ink droplets to be precisely sprayed into a designated pixel light emitting region. Normally, the above pixel defining layer has a plurality of openings, and in a process of ink jet printing, the solution is accurately printed in the openings of the pixel defining layer in an ink jet manner so as to form the light emitting layers. However, the ink of ink jet printing may be unevenly diffused in the opening, which results in that thicknesses of the light emitting layer at different positions of the opening are uneven. Particularly when edge lengths of the opening are unequal, for example, an opening has a long edge and a short edge, because a width of the short edge is relatively smaller than a width of the long edge, evenness of diffusion of the light emitting layer at the short edge may be lower than evenness of diffusion of the light emitting layer at the long edge. Therefore, a display apparatus is uneven in pixel luminance when emitting light, and a display effect of the display apparatus is severely affected.

Figure 2A:
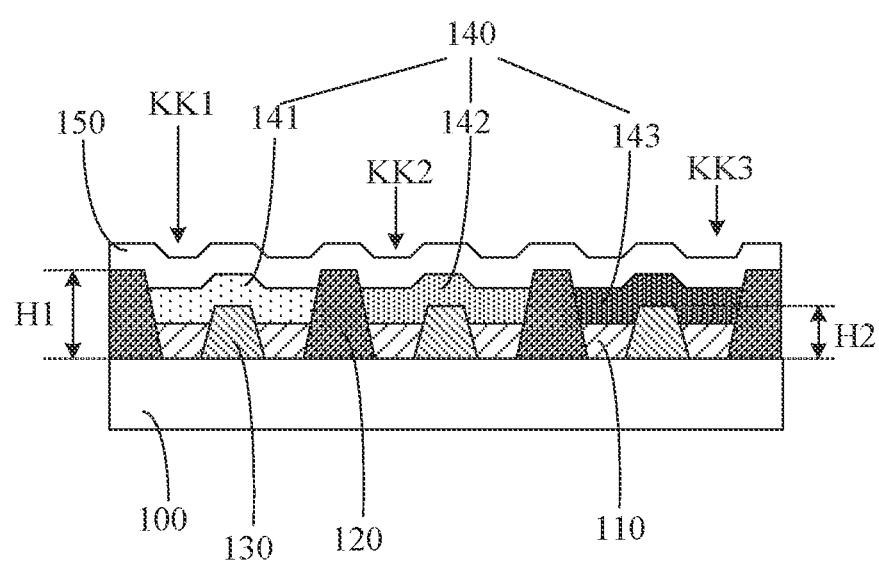
FIG. 2A is a schematic section view of the array substrates shown in FIG. 1 in direction AA'.
Figure 2B:
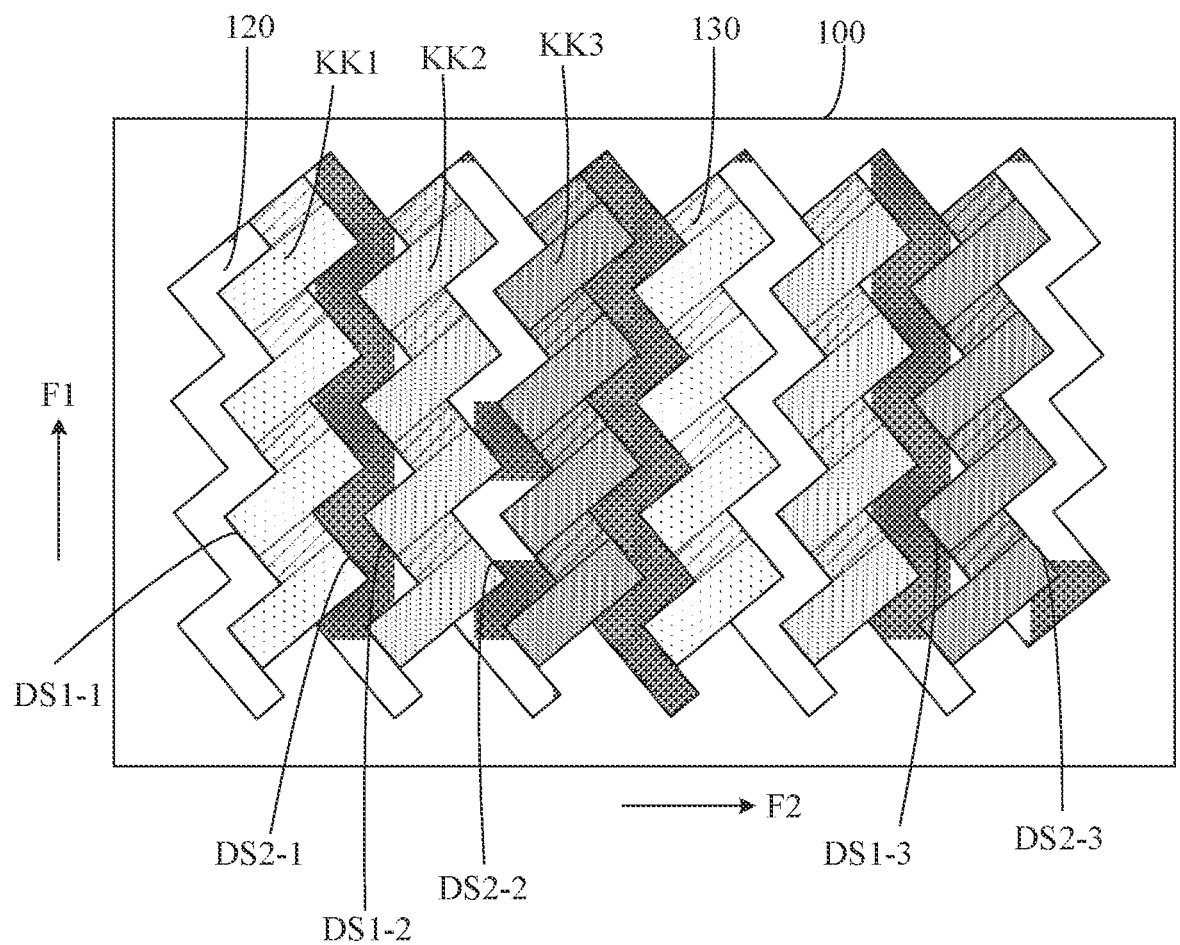
FIG. 2B is a schematic top view of other array substrates in embodiments of the present disclosure.

In view of this, embodiments of the present disclosure provide an array substrate, as shown in FIG. 1 to FIG. 2B, including:

a base substrate 100;

a first electrode layer, located on the base substrate 100, and including a plurality of first electrodes 110 spaced apart from each other;

a pixel defining layer, located on one side, facing away from the base substrate 100, of the first electrode layer; where the pixel defining layer includes: first sub defining layers 120 and second sub defining layers 130 which are in contact with each other; the first sub defining layers 120 and the second sub defining layers 130 define a plurality of pixel openings; and an orthographic projection of one of the pixel openings on the base substrate 100 is located in an orthographic projection of one of the first electrodes on the base substrate 100; and a light emitting functional layer 140, located on one side, facing away from the base substrate 100, of the pixel defining layer; where the light emitting functional layer 140 includes a plurality of light emitting layers with different colors; the light emitting layers are located in the pixel openings; light emitting layers in at least two adjacent pixel openings along a first direction F1 are the same in color; light emitting layers in at least two adjacent pixel openings along a second direction F2 are different in color; and the first direction F1 is different from the second direction F2;

where each of the first sub defining layers 120 is located between two adjacent pixel openings provided with light emitting layers with different colors, and each first sub defining layer 120 has a first height H1 in a direction perpendicular to a plane where the base substrate 100 is located;

each of the second sub defining layers 130 is located between two adjacent pixel openings provided with light emitting layers with the same color, and each second sub defining layer 130 has a second height H2 in the direction perpendicular to the plane where the base substrate 100 is located; and the first height H1 is greater than the second height H2.

According to the array substrate provided by the embodiments of the present disclosure, the pixel defining layer includes the first sub defining layers and the second sub defining layers which are in contact with each other, and the first height of the first sub defining layer in the direction perpendicular to the plane where the base substrate is located is greater than the second height of the second sub defining layer in the direction perpendicular to the plane where the base substrate is located. In this way, when an ink jet printing process is adopted to form the light emitting layers in the pixel openings, the light emitting layers with different colors may be spaced apart through the first sub defining layers. Because the second height of the second sub defining layer is smaller, materials of the light emitting layers with the same color may flow between adjacent pixel openings, which is equivalent to increasing a diffusion range of light emitting materials, so that evenness of film forming of the light emitting layers may be improved, thereby improving a display effect of a display apparatus.

During specific implementation, in the embodiments of the present disclosure, as shown in FIG. 1, each pixel opening has a long edge and a short edge. Exemplarily, a shape of each pixel opening is a rectangle, a long edge of the rectangle may serve as the long edge of the pixel opening, and a short edge of the rectangle may serve as the short edge of the pixel opening. Of course, in practical application, the pixel opening may have other shapes, which may be determined through design based on a practical application environment and is not limited herein.

During specific implementation, in the embodiments of the present disclosure, as shown in FIG. 2A, a second electrode layer 150 is further arranged on one side, facing away from the base substrate 100, of the light emitting functional layer 140, so that the first electrodes 110, the light emitting layers and the second electrode layer may form a laminated structure, thereby forming an electroluminescent diode. Exemplarily, the material of the light emitting layer may be organic electroluminescent material, so that the electroluminescent diode may be an organic electroluminescent diode. The material of the light emitting layer may also be quantum dot electroluminescent material, so that the electroluminescent diode may be a quantum dot electroluminescent diode. It should be noted that, a region where the pixel opening of the pixel defining layer is located is a light emitting region of a sub pixel where the electroluminescent diode is located.

During specific implementation, in the embodiments of the present disclosure, a transistor array layer is further arranged between the first electrode layer and the base substrate 100. The transistor array layer may include a plurality of pixel circuits, and one of the first electrodes 110 is electrically connected with one of the pixel circuits, so that a driving current is input to the first electrodes 110 through the pixel circuits and a corresponding voltage is applied to the second electrode layer, thereby driving the light emitting layers to emit light. Exemplarily, each pixel circuit may include a storage capacitor and a transistor which is electrically connected with the storage capacitor. For example, pixel circuits may include at least one of a 2T1C pixel circuit, a 3T1C pixel circuit, or a 7T1C pixel circuit. In practical application, a structure of each pixel circuit may be basically the same as that in the related art, which is not repeated here.

During specific implementation, in the embodiments of the present disclosure, as shown in FIG. 1, an orthographic projection of the second sub defining layer 130 on the base substrate 100 is close to orthographic projections of short edges of two adjacent pixel openings provided with the light emitting layers with the same color on the base substrate 100. In this way, a range of short edges of the two adjacent pixel openings provided with the light emitting layers with the same color may be widened through the second sub defining layer 130. Therefore, a range of diffusion of the light emitting materials, achieved by the short edges of the pixel openings, may be widened.

During specific implementation, in the embodiments of the present disclosure, as shown in FIG. 1, the first sub defining layer 120 is a continuous broken-line structure, and an orthographic projection of the first sub defining layer 120 on the base substrate 100 bends and extends roughly along the first direction F1. In this way, each first sub defining layer 120 is arranged in a broken-line-shaped integral structure.

During specific implementation, in the embodiments of the present disclosure, as shown in FIG. 1, in the second direction F2, a plurality of second sub defining layers 130 are arranged between two adjacent first sub defining layers 120, and the plurality of second sub defining layers 130 located between the two adjacent first sub defining layers 120 are arranged at intervals. In this way, the second sub defining layers 130 are arranged in non-continuous structures.

During specific implementation, in the embodiments of the present disclosure, as shown in FIG. 1, the array substrate includes a plurality of repetitive units PX, the plurality of repetitive units PX are arranged into a plurality of repetitive unit PX sets along the second direction F2, and the plurality of repetitive unit PX sets are arranged along the first direction F1. Each repetitive unit PX includes a plurality of pixel openings arranged in sequence along the second direction F2, and light emitting layers of a same repetitive unit PX set are different in color. In other words, each repetitive unit PX includes a plurality of sub pixels, and one sub pixel includes one pixel opening. In this way, light emitting layers of different sub pixels in the repetitive unit PX may emit light to achieve color mixture, thereby realizing a display function.

Exemplarily, the first direction is perpendicular to the second direction. For example, the first direction may be a pixel row direction, and the second direction may be a pixel column direction. Or, the first direction may be the pixel column direction, and the second direction may be the pixel row direction. These may be determined through design based on needs of practical application, which is not limited here.

Exemplarily, as shown in FIG. 1 to FIG. 2B, the light emitting layer 140 includes a first color light emitting layer 141, a second color light emitting layer 142 and a third color light emitting layer 143. In some examples, a first color, a second color and a third color may be selected from red, green and blue. For example, the first color is red, the second color is green, and the third color is blue. Of course, the embodiments of the present disclosure include but are not limited to them. The first color, the second color, and the third color above may also be other colors.

During specific implementation, in the embodiments of the present disclosure, as shown in FIG. 1 to FIG. 2B, the plurality of pixel openings include a first pixel opening KK1, a second pixel opening KK2 and a third pixel opening KK3. The first color light emitting layer 141 is located in the first pixel opening KK1, the second color light emitting layer 142 is located in the second pixel opening KK2, and the third color light emitting layer 143 is located in the third pixel opening KK3. Exemplarily, each repetitive unit PX includes a first pixel opening KK1, a second pixel opening KK2 and a third pixel opening KK3 arranged in sequence along the second direction F2. That is, each repetitive unit PX includes a first color sub pixel, a second color sub pixel, and a third color sub pixel which are arranged in sequence along the second direction F2.

During specific implementation, in the embodiments of the present disclosure, as shown in FIG. 1, an included angle β between an extending direction F3 of the long edge of each pixel opening and the second direction F2 is larger than 0 degree and smaller than 90 degrees. Exemplarily, the included angle β between the extending direction F3 of the long edge of each pixel opening and the second direction F2 is an acute angle.

During specific implementation, in the embodiments of the present disclosure, as shown in FIG. 1, in the same repetitive unit PX, each pixel opening has a first short edge and a second short edge opposite to each other; and the first short edge and the second short edge are respectively close to light emitting layers with different colors. For example, each first pixel opening KK1 has a first short edge DS1-1 and a second short edge DS2-1 opposite to each other, the first short edge DS1-1 is close to the third color light emitting layer 143, and the second short edge DS2-1 is close to the second color light emitting layer 142. Each second pixel opening KK2 has a first short edge DS1-2 and a second short edge DS2-2 opposite to each other, the first short edge DS1-2 is close to the first color light emitting layer 141, and the second short edge DS2-2 is close to the third color light emitting layer 143. Each third pixel opening KK3 has a first short edge DS1-3 and a second short edge DS2-3 opposite to each other, the first short edge DS1-3 is close to the second color light emitting layer 142, and the second short edge DS2-3 is close to the first color light emitting layer 141.

During specific implementation, in the embodiments of the present disclosure, as shown in FIG. 1, for two pixel openings arranged in sequence along the first direction F1, a first short edge of a first pixel opening in the two pixel openings, a second short edge of a second pixel opening in the two pixel openings, and the second sub defining layer arranged between the two pixel openings have an overlapping region in the first direction F1. In this way, the short edges of the adjacent pixel openings along the first direction F1 may communicate through the second sub defining layer 130 which has a smaller height, which is equivalent to widening the short edges of the adjacent pixel openings along the first direction F1. Therefore, when the ink jet printing process is adopted to form the light emitting layers in the pixel openings, fluidity at the short edges of the pixel openings may be improved, and the light emitting materials may be diffused evenly at the short edges of the pixel openings, thereby improving evenness of the formed light emitting layers.

During specific implementation, in the embodiments of the present disclosure, as shown in FIG. 1, the first short edge of the first pixel opening is located at one end of the second sub defining layer 130 arranged between the two pixel openings, and the second short edge of the second pixel opening is located at the other end of the second sub defining layer 130 arranged between the two pixel openings. In this way, the short edges of the adjacent pixel openings along the first direction F1 may be widened as much as possible. Therefore, when the ink jet printing process is adopted to form the light emitting layers in the pixel openings, the fluidity at the short edges of the pixel openings may be improved, and the light emitting materials may be diffused evenly at the short edges of the pixel openings, thereby improving the evenness of the formed light emitting layers.

Exemplarily, as shown in FIG. 1 and FIG. 2B, for two adjacent first pixel openings KK1 along the first direction F1, the first short edge DS1-1 of the first of the first pixel openings KK1, the second short edge DS2-1 of the second of the first pixel openings KK1, and the second sub defining layer 130 arranged between the two first pixel openings KK1 have an overlapping region in the first direction F1. The first short edge DS1-1 of the first of the first pixel openings KK1 is located at one end of the second sub defining layer 130, and the second short edge DS2-1 of the second of the first pixel openings KK1 is located at the other end of the second sub defining layer 130. The first sub defining layers 120 are arranged adjacent to the first short edges DS1-1 and the second short edges DS2-1 of the first pixel openings KK1, so that the short edges of the adjacent first pixel openings KK1 along the first direction F1 may communicate through the second sub defining layer 130 which has a smaller height. When the ink jet printing process is adopted to form the light emitting layers in the pixel openings, the fluidity at the short edges of the first pixel openings KK1 may be improved, and the light emitting materials may be diffused evenly at the short edges of the first pixel openings KK1, thereby improving the evenness of the formed light emitting layers.

Exemplarily, as shown in FIG. 1 and FIG. 2B, for two adjacent second pixel openings KK2 along the first direction F1, the first short edge DS1-2 of the first of the second pixel openings KK2, the second short edge DS2-2 of the second of the second pixel openings KK2, and the second sub defining layer 130 arranged between the two second pixel openings KK2 have an overlapping region in the first direction F1. The first short edge DS1-2 of the first of the second pixel openings KK2 is located at one end of the second sub defining layer 130, and the second short edge DS2-2 of the second of the second pixel openings KK2 is located at the other end of the second sub defining layer 130. The first sub defining layers 120 are arranged adjacent to the first short edges DS1-2 and the second short edges DS2-2 of the second pixel openings KK2, so that the short edges of the adjacent second pixel openings KK2 along the first direction F1 may communicate through the second sub defining layer 130 which has a smaller height. When the ink jet printing process is adopted to form the light emitting layers in the pixel openings, the fluidity at the short edges of the second pixel openings KK2 may be improved, and the light emitting materials may be diffused evenly at the short edges of the second pixel openings KK2, thereby improving the evenness of the formed light emitting layers.

Exemplarily, as shown in FIG. 1 and FIG. 2B, for two adjacent third pixel openings KK3 along the first direction F1, the first short edge DS1-3 of the first of the third pixel openings KK3, the second short edge DS2-3 of the second of the third pixel openings KK3, and the second sub defining layer 130 arranged between the two third pixel openings KK3 have an overlapping region in the first direction F1. The first short edge DS1-3 of the first of the third pixel openings KK3 is located at one end of the second sub defining layer 130, and the second short edge DS2-3 of the second of the third pixel openings KK3 is located at the other end of the second sub defining layer 130. The first sub defining layers 120 are arranged adjacent to the first short edges DS1-3 and the second short edges DS2-3 of the third pixel openings KK3, so that the short edges of the adjacent third pixel openings KK3 along the first direction F1 may communicate through the second sub defining layer 130 which has a smaller height. When the ink jet printing process is adopted to form the light emitting layers in the pixel openings, the fluidity at the short edges of the third pixel openings KK3 may be improved, and the light emitting materials may be diffused evenly at the short edges of the third pixel openings KK3, thereby improving the evenness of the formed light emitting layers.

It should be noted that, in the embodiments of the present disclosure, the orthographic projection of the second sub defining layer 130 on the base substrate 100 is close to the orthographic projections of the short edges of two adjacent pixel openings provided with the light emitting layers with the same color on the base substrate 100, which means that: the second sub defining layer 130 shown in FIG. 1 is arranged between the long edges of two adjacent pixel openings along the first direction F1, and the second sub defining layer 130 is simultaneously close to one of the short edges of each of the two adjacent pixel openings. For example, to take the first pixel openings KK1 as an example, the second sub defining layer 130 is simultaneously close to the first short edge DS1-1 of the first of the first pixel openings KK1 and the second short edge DS1-2 of the second of the first pixel openings KK1.

Figure 3:
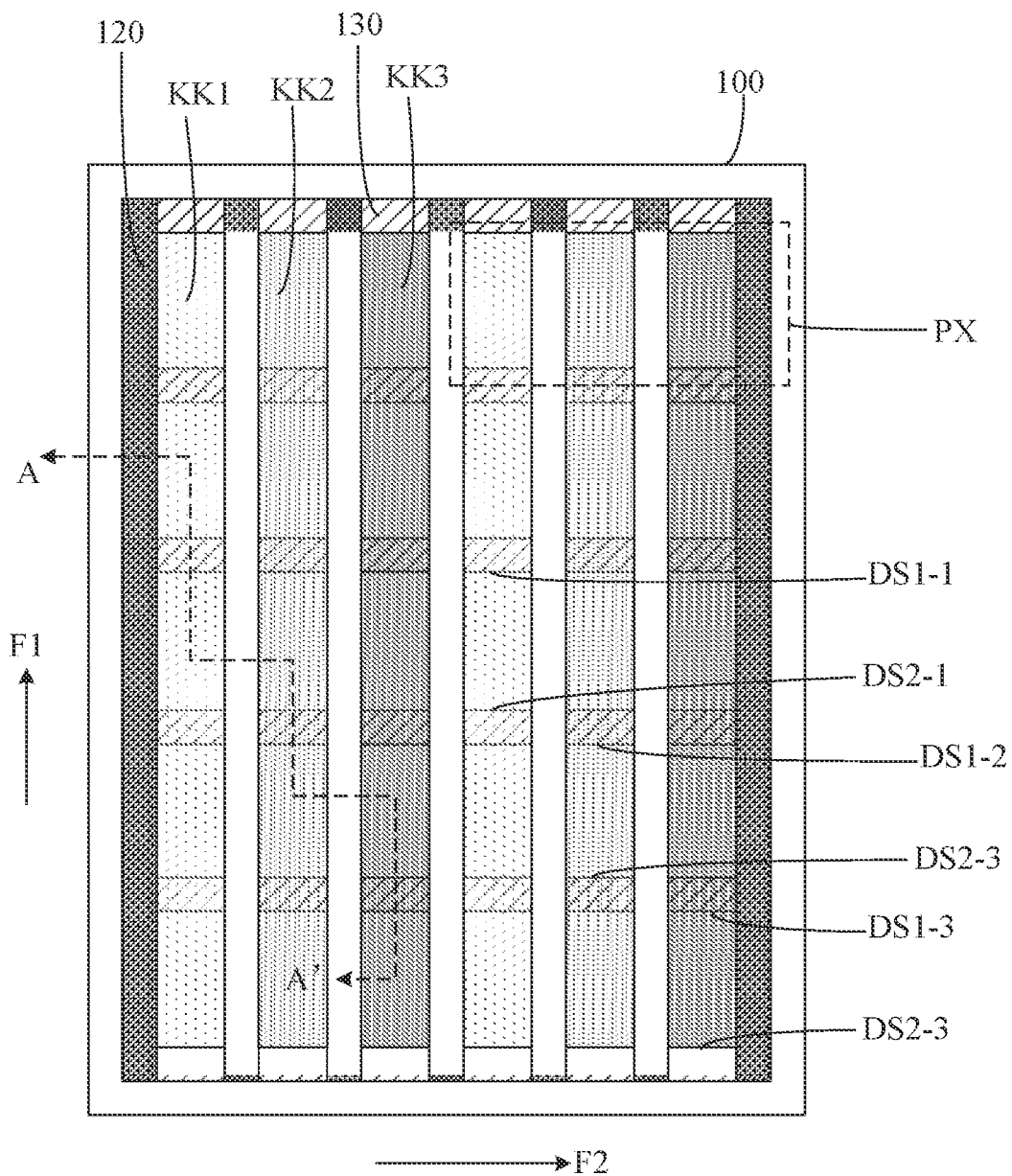
FIG. 3 is a schematic top view of further other array substrates in embodiments of the present disclosure.

Embodiments of the present disclosure provide other array substrates. Schematic structural diagrams of the array substrates are shown in FIG. 3, which are transformed based on the implementations of the above embodiments. Only differences of these embodiments from the above embodiments are described below, and the same parts are not repeated herein.

Figure 4:
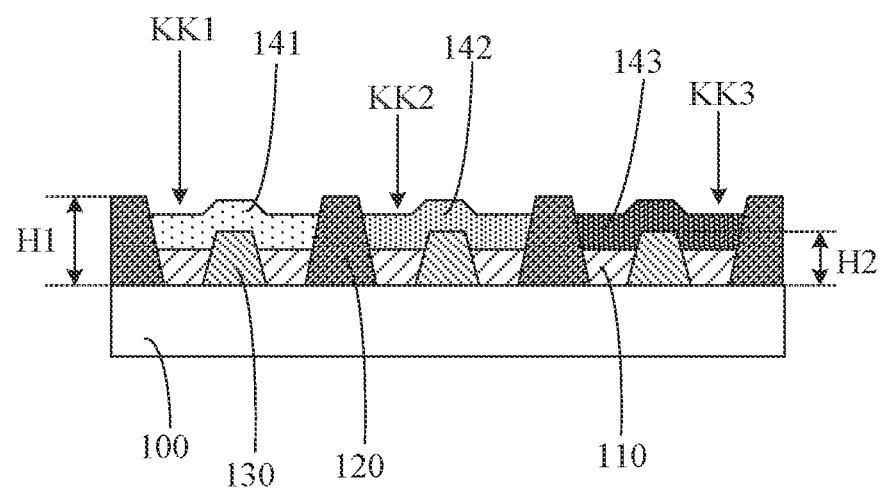
FIG. 4 is a schematic section view of the array substrates shown in FIG. 3 in direction AA'

During specific implementation, in the embodiments of the present disclosure, as shown in FIG. 3 and FIG. 4, an extending direction of long edges of pixel openings are roughly the same as a first direction F1. An orthographic projection of a second sub defining layer 130 on a base substrate 100 is located between orthographic projections of short edges of two adjacent pixel openings provided with light emitting layers with the same color on the base substrate 100. Further, a width of the second sub defining layer 130 in a second direction F2 is roughly equal to a width of an orthographic projection of a short edge of an adjacent pixel opening on the base substrate 100. In this way, short edges of adjacent first pixel openings KK1 along the first direction F1 may communicate through the second sub defining layer 130 which has a smaller height, which is equivalent to cancelling the short edges, so light emitting materials may be further diffused evenly, thereby improving evenness of formed light emitting layers.

During specific implementation, in the embodiments of the present disclosure, as shown in FIG. 3, a first sub defining layer 120 is a continuous straight-line structure, and an orthographic projection of the first sub defining layer 120 on the base substrate 100 extends roughly in the first direction F1. In this way, each first sub defining layer 120 is arranged in a straight-line-shaped integral structure.

During specific implementation, in the embodiments of the present disclosure, as shown in FIG. 3, in the second direction F2, a plurality of second sub defining layers 130 are arranged between two adjacent first sub defining layers 120, and the plurality of second sub defining layers 130 located between the two adjacent first sub defining layers

120 are arranged at intervals. In this way, the second sub defining layers 130 are arranged in non-continuous structures.

Exemplarily, as shown in FIG. 3 and FIG. 4, light emitting layers in one column are the same in color. For two adjacent first pixel openings KK1 in the same column, a second sub defining layer 130 is arranged between a first short edge DS1-1 of the first of the first pixel openings KK1 and a second short edge DS2-1 of the second of the first pixel openings KK1. In this way, short edges of the adjacent first pixel openings KK1 along the first direction F1 may communicate through the second sub defining layer 130 which has a smaller height, which is equivalent to cancelling the short edges. Therefore, when an ink jet printing process is adopted to form the light emitting layers in the pixel openings, the fluidity at the short edges of the first pixel openings KK1 may be improved, and the light emitting materials may be diffused evenly at the short edges of the first pixel openings KK1, thereby improving the evenness of the formed light emitting layers.

Exemplarily, as shown in FIG. 3 and FIG. 4, for two adjacent second pixel openings KK2 in the same column, a second sub defining layer 130 is arranged between a first short edge DS1-2 of the first of the second pixel openings KK2 and a second short edge DS2-2 of the second of the second pixel openings KK2. In this way, short edges of the adjacent second pixel openings KK2 along the first direction F1 may communicate through the second sub defining layer 130 which has a smaller height, which is equivalent to cancelling the short edges. Therefore, when the ink jet printing process is adopted to form the light emitting layers in the pixel openings, the fluidity at the short edges of the second pixel openings KK2 may be improved, and the light emitting materials may be diffused evenly at the short edges of the second pixel openings KK2, thereby improving the evenness of the formed light emitting layers.

Exemplarily, as shown in FIG. 3 and FIG. 4, for two adjacent third pixel openings KK3 in the same column, a second sub defining layer 130 is arranged between a first short edge DS1-3 of the first of the third pixel openings KK3 and a second short edge DS2-3 of the second of the third pixel openings KK3. In this way, short edges of the adjacent third pixel openings KK3 along the first direction F1 may communicate through the second sub defining layer 130 which has a smaller height, which is equivalent to cancelling the short edges. Therefore, when the ink jet printing process is adopted to form the light emitting layers in the pixel openings, the fluidity at the short edges of the third pixel openings KK3 may be improved, and the light emitting materials may be diffused evenly at the short edges of the third pixel openings KK3, thereby improving the evenness of the formed light emitting layers.

It should be noted that, in the embodiments of the present disclosure, the orthographic projection of the second sub defining layer 130 on the base substrate 100 is close to the orthographic projections of the short edges of two adjacent pixel openings provided with the light emitting layers with the same color on the base substrate 100, which means that: the second sub defining layer 130 shown in FIG. 3 is arranged between the short edges of two adjacent pixel openings along the first direction F1. For example, to take the first pixel openings KK1 as an example, the second sub defining layer 130 is simultaneously close to the first short edge DS1-1 of the first of the first pixel openings KK1 and the second short edge DS1-2 of the second of the first pixel openings KK1.

It should be noted that, in a practical process, due to limitation of process conditions or other factors, the above same features may not be complete identical, and some deviation may exist. Therefore, as long as the same relations among the above features roughly satisfy the above conditions, the features all belong to the protection scope of the present disclosure. For example, the above same may be allowed same within an allowable error range.

Figure 5:
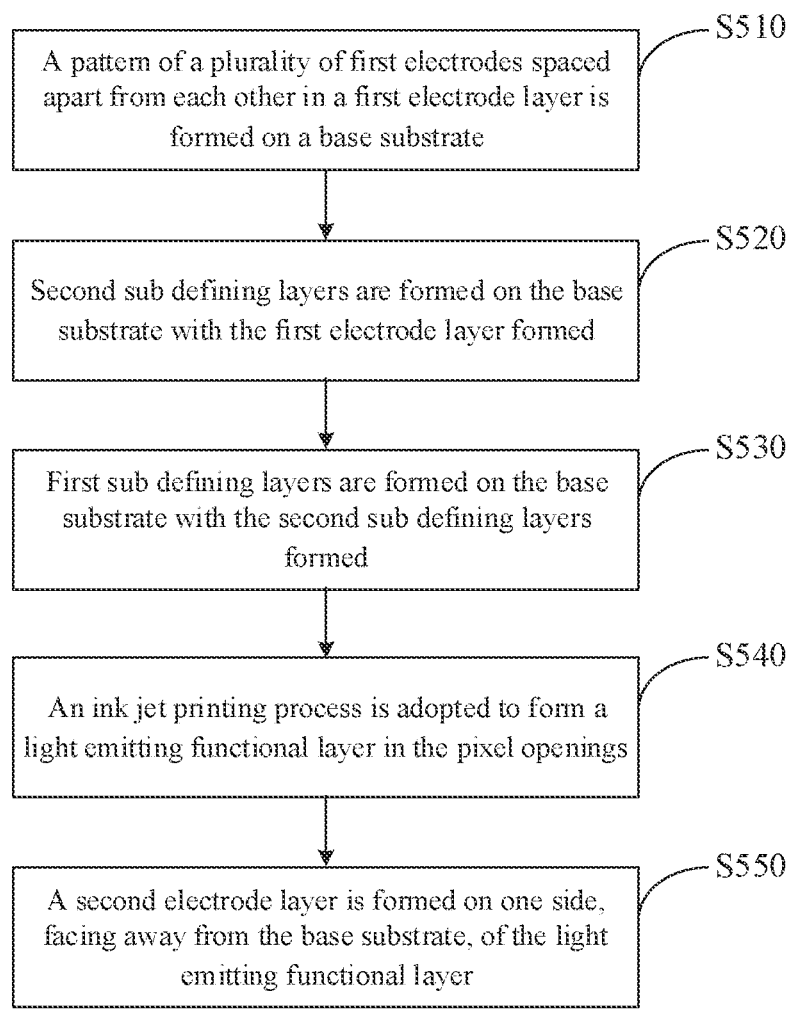
FIG. 5 is a flow chart of a preparation method of some array substrates in embodiments of the present disclosure.

Embodiments of the present disclosure further provide a preparation method of the above array substrate. As shown in FIG. 5, the preparation method may include the following steps.

S510, a pattern of a plurality of first electrodes spaced apart from each other in a first electrode layer is formed on a base substrate.

S520, second sub defining layers are formed on the base substrate with the first electrode layer formed, where each second sub defining layer 130 has a second height H2 in a direction perpendicular to a plane where the base substrate 100 is located.

S530, first sub defining layers are formed on the base substrate with the second sub defining layers formed, where each first sub defining layer 120 has a first height H1 in the direction perpendicular to the plane where the base substrate 100 is located, the first height H1 is greater than the second height H2, the first sub defining layers 120 and the second sub defining layers 130 are in contact with each other to define a plurality of pixel openings, and an orthographic projection of one of the pixel openings on the base substrate 100 is located in an orthographic projection of one of the first electrodes on the base substrate 100.

S540, an ink jet printing process is adopted to form a light emitting functional layer in the pixel openings, where the light emitting functional layer 140 includes a plurality of light emitting layers with different colors, the light emitting layers are located in the pixel openings, light emitting layers in at least two adjacent pixel openings along a first direction F1 are the same in color, light emitting layers in at least two adjacent pixel openings along a second direction F2 are different in color, the first direction F1 is different from the second direction F2, each second sub defining layer 130 is located between two adjacent pixel openings provided with light emitting layers with the same color, and each first sub defining layer 120 is located between two adjacent pixel openings provided with light emitting layers with different colors.

S550, a second electrode layer is formed on one side, facing away from the base substrate, of the light emitting functional layer.

During specific implementation, in the embodiments of the present disclosure, before step S510, the method further includes: forming a transistor array layer on the base substrate Specific embodiments will be adopted below, as shown in FIGS. 6A to 6E, to explain and describe the preparation method of the array substrate provided by the embodiments of the present disclosure.

The preparation method of the array substrate provided by the embodiments of the present disclosure may include the following steps.

(1) The transistor array layer is formed on the base substrate 100. For example, film layers to be patterned in a manufacturing process of the transistor array layer is sequentially: an active layer, a gate metal layer, an interlayer insulating layer, a source-drain metal layer, and a flat layer.

Figure 6A:
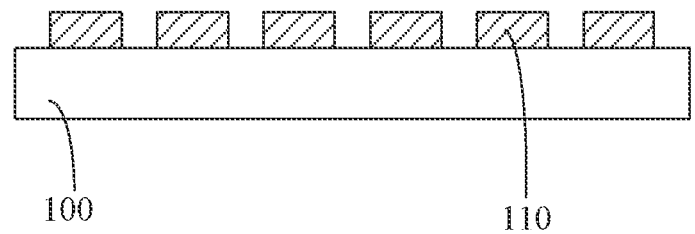
FIG. 6A is a schematic section view of array substrates in embodiments of the present disclosure during preparation.

(2) A single patterning process is adopted to form the pattern of the plurality of first electrodes 110 spaced apart from each other on one side, facing away from the base substrate 100, of the flat layer, as shown in FIG. 6A.

Figure 6B:
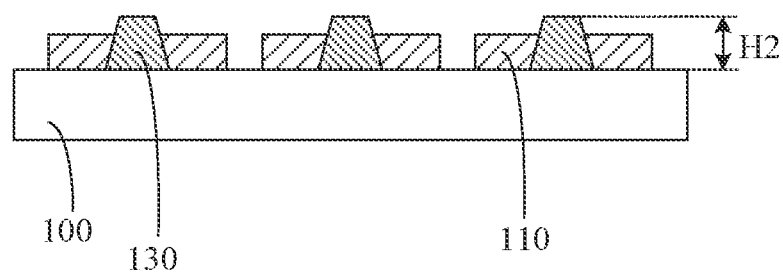
FIG. 6B is another schematic section view of array substrates in embodiments of the present disclosure during preparation.

(3) The single patterning process is adopted to form the second sub defining layers 130 on the base substrate 100 with the first electrode layer formed, as shown in FIG. 6B.

Figure 6C:
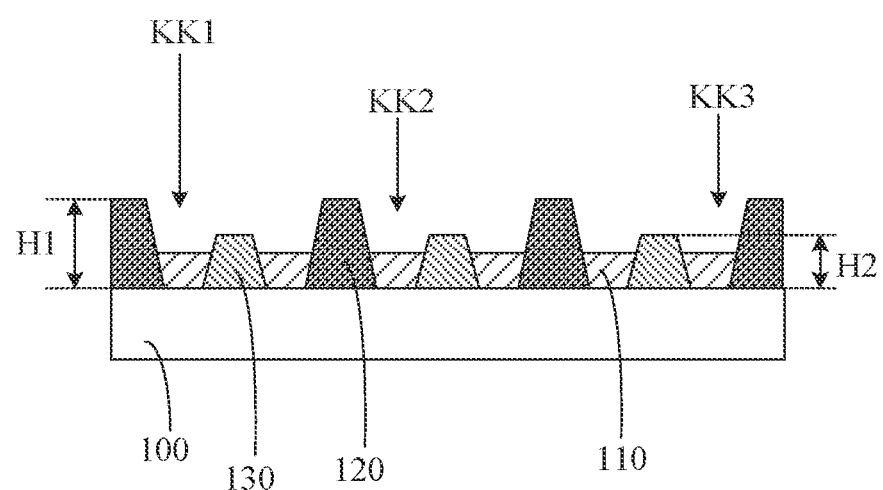
FIG. 6C is another schematic section view of array substrates in embodiments of the present disclosure during preparation.

(4) The single patterning process is adopted to form the first sub defining layers 120 on the base substrate 100 with the second sub defining layers 130 formed, as shown in FIG. 6C. The second sub defining layer 130 has the second height H2 in the direction perpendicular to the plane where the base substrate 100 is located, the first sub defining layer 120 has the first height H1 in the direction perpendicular to the plane where the base substrate 100 is located, and the first height H1 is greater than the second height H2. The first sub defining layers 120 and the second sub defining layers 130 are in contact with each other, to define the plurality of pixel openings.

Figure 6D:
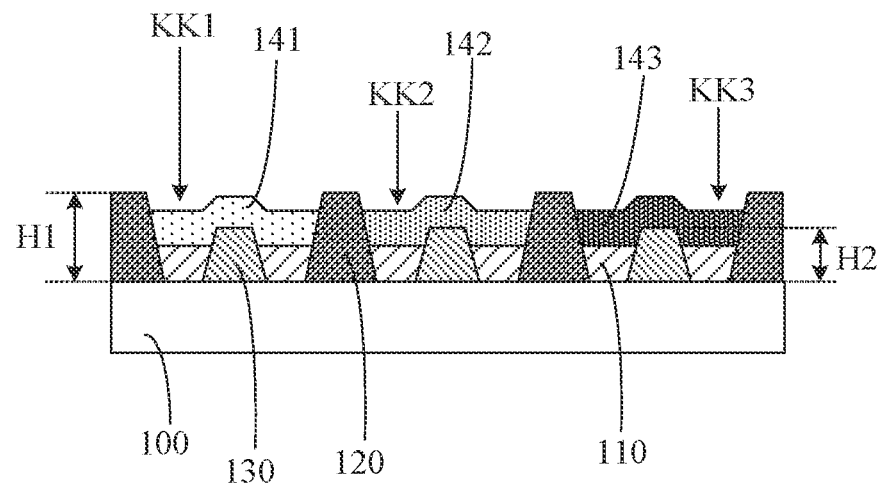
FIG. 6D is another schematic section view of array substrates in embodiments of the present disclosure during preparation.

(5) The ink jet printing process is adopted to spray light emitting materials to the pixel openings so as to form light emitting layers with different layers, thereby forming the light emitting functional layer 140, as shown in FIG. 6D.

Figure 6E:
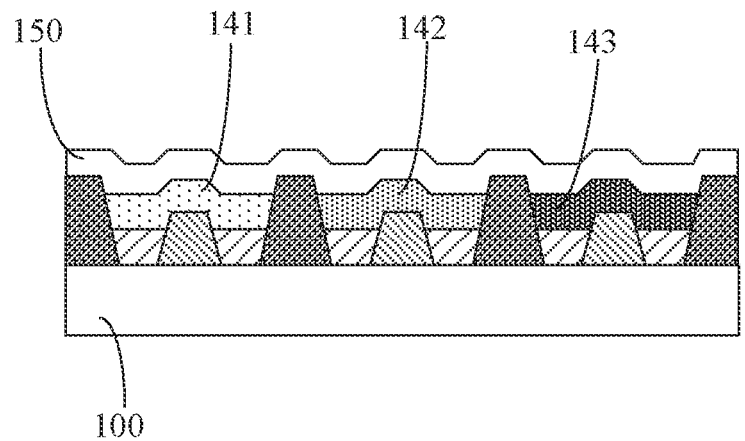
FIG. 6E is another schematic section view of array substrates in embodiments of the present disclosure during preparation.

(6) The second electrode layer is formed on one side, facing away from the base substrate 100, of the light emitting functional layer 140, as shown in FIG. 6E. The second electrode layer may be a whole-surface structure covering the base substrate 100.

Based on the same inventive concept, embodiments of the present disclosure further provide a display panel. A problem-solving principle of the display panel is similar to a problem-solving principle of the above array substrate, so for implementation of the display panel, reference may be made to implementation of the aforesaid array substrate, and repetition will not be made here.

Based on the same inventive concept, embodiments of the present disclosure further provide a display apparatus, including the above display panel provided by the embodiments of the present disclosure. A problem-solving principle of the display apparatus is similar to a problem-solving principle of the above display panel, so for implementation of the display apparatus, reference may be made to implementation of the aforesaid display panel, and repetition will not be made here.

During specific implementation, in the embodiment of the present disclosure, the display apparatus may be any product or component with a display function, such as a mobile phone, a tablet computer, a television, a monitor, a notebook computer, a digital photo frame, a navigator, and the like. Other indispensable constituent parts of the display apparatus are understood by those of ordinary skill in the art as should be provided, which will not be repeated here, nor should it be used as a limitation to the present disclosure.

According to the above array substrate, the preparation method, the display panel and the display apparatus provided by the embodiments of the present disclosure, the pixel defining layer includes the first sub defining layers and the second sub defining layers which are in contact with each other, and the first height of the first sub defining layer in the direction perpendicular to the plane where the base substrate is located is greater than the second height of the second sub defining layer in the direction perpendicular to the plane where the base substrate is located. In this way, when the ink jet printing process is adopted to form the light emitting layers in the pixel openings, the light emitting layers with different colors may be spaced apart through the first sub defining layers. Because the second height of the second sub defining layer is smaller, the materials of the light emitting layers with the same color may flow between the adjacent pixel openings, which is equivalent to increasing the diffusion range of the light emitting materials, so the evenness of film forming of the light emitting layers may be improved, thereby improving the display effect of the display apparatus.

Obviously, those of skill in the art can make various modifications and variations to the present disclosure without departing from the spirit and scope of the present disclosure. In this way, if these modifications and variations of the present disclosure fall within the scope of the claims of the present disclosure and equivalent technologies, the present disclosure also intends to include these modifications and variations.

What is claimed is:

1. An array substrate, comprising:
a base substrate;
a first electrode layer, arranged on the base substrate, and comprising a plurality of first electrodes spaced apart from each other;
a pixel defining layer, arranged on one side, facing away from the base substrate, of the first electrode layer; wherein the pixel defining layer comprises: first sub defining layers and second sub defining layers which are in contact with each other; the first sub defining layers and the second sub defining layers define a plurality of pixel openings; and an orthographic projection of one of the plurality of pixel openings on the base substrate is in an orthographic projection of one of the first electrodes on the base substrate; and
a light emitting functional layer, arranged on one side, facing away from the base substrate, of the pixel defining layer; wherein the light emitting functional layer comprises a plurality of light emitting layers with different colors; wherein the plurality of light emitting layers are arranged in the plurality of pixel openings, light emitting layers in at least two adjacent pixel openings along a first direction are identical in color, light emitting layers in at least two adjacent pixel openings along a second direction are different in color, and the first direction is different from the second direction;
wherein each of the first sub defining layers is arranged between two adjacent pixel openings provided with light emitting layers with different colors, and the each first sub defining layer has a first height in a direction perpendicular to the base substrate;
each of the second sub defining layers is arranged between two adjacent pixel openings provided with light emitting layers with a same color, and the each second sub defining layer has a second height in the direction perpendicular to the base substrate; and
the first height is greater than the second height;
wherein each of the plurality of pixel openings has a long edge and a short edge, and an orthographic projection of the each second sub defining layer on the base substrate is close to orthographic projections of short edges of the two adjacent pixel openings provided with the light emitting layers with the same color on the base substrate;
wherein the array substrate comprises a plurality of repetitive units, the plurality of repetitive units are arranged into a plurality of repetitive unit sets along the second direction, and the plurality of repetitive unit sets are arranged along the first direction; and each of the plurality of repetitive units comprises a plurality of pixel openings arranged in sequence along the second direction, wherein light emitting layers of a same repetitive unit set are different in color;

wherein in a same repetitive unit, the each pixel opening has a first short edge and a second short edge opposite to each other; and for two pixel openings arranged in sequence along the first direction, the first short edge of a first pixel opening in the two pixel openings, the second short edge of a second pixel opening in the two pixel openings, and a second sub defining layer arranged between the two pixel openings have an overlapping region in the first direction.

2. The array substrate according to claim 1, wherein the each first sub defining layer is a continuous broken-line structure, and an orthographic projection of the each first sub defining layer on the base substrate bends and extends roughly along the first direction; and in the second direction, a plurality of second sub defining layers are arranged between two adjacent first sub defining layers, and the plurality of second sub defining layers arranged between the two adjacent first sub defining layers are arranged at intervals.

3. The array substrate according to claim 1, wherein the each first sub defining layer is a continuous straight-line structure, and an orthographic projection of the each first sub defining layer on the base substrate extends roughly in the first direction; and in the second direction, a plurality of second sub defining layers are arranged between two adjacent first sub defining layers, and the plurality of second sub defining layers arranged between the two adjacent first sub defining layers are arranged at intervals.

4. The array substrate according to claim 1, wherein an included angle between an extending direction of the long edge of the each pixel opening and the second direction is larger than 0 degree and smaller than 90 degrees.

5. The array substrate according to claim 1, wherein the first short edge of the first pixel opening is arranged at one end of the second sub defining layer arranged between the two pixel openings, and the second short edge of the second pixel opening is arranged at the other end of the second sub defining layer arranged between the two pixel openings.

6. The array substrate according to claim 1, wherein an extending direction of the long edge of the each pixel opening and the first direction are roughly identical; and the orthographic projection of the each second sub defining layer on the base substrate is arranged between orthographic projections of the short edges of the two adjacent pixel openings provided with the light emitting layers with the same color on the base substrate.

7. The array substrate according to claim 6, wherein a width of the each second sub defining layer in the second direction is roughly equal to a width of the orthographic projection of the short edge of the adjacent pixel opening on the base substrate.

8. The array substrate according to claim 1, wherein the light emitting functional layer comprises a first color light emitting layer, a second color light emitting layer and a third color light emitting layer;

the plurality of pixel openings comprise a first pixel opening, a second pixel opening and a third pixel opening, wherein the first color light emitting layer is arranged in the first pixel opening, the second color light emitting layer is arranged in the second pixel opening, and the third color light emitting layer is arranged in the third pixel opening; and each of the plurality of repetitive units comprises the first pixel opening, the second pixel opening and the third pixel opening arranged in sequence along the second direction.

9. A preparation method of the array substrate according to claim 1, comprising:

forming, on the base substrate, a pattern of the plurality of first electrodes spaced apart from each other in the first electrode layer;

forming the second sub defining layers on the base substrate with the first electrode layer formed, wherein the each second sub defining layer has the second height in the direction perpendicular to the base substrate;

forming the first sub defining layers on the base substrate with the second sub defining layers formed, wherein the each first sub defining layer has the first height in the direction perpendicular to the base substrate, the first height is greater than the second height, the first sub defining layers and the second sub defining layers are in contact with each other to define the plurality of pixel openings, and the orthographic projection of the one pixel opening on the base substrate is arranged in the orthographic projection of the one first electrode on the base substrate; and forming the light emitting functional layer in the plurality of pixel openings by adopting an ink jet printing process, wherein the light emitting functional layer comprises the plurality of light emitting layers with different colors, the light emitting layers are arranged in the pixel openings, the light emitting layers in at least two adjacent pixel openings along the first direction are identical in color, the light emitting layers in at least two adjacent pixel openings along the second direction are different in color, and the first direction is different from the second direction;

wherein the each second sub defining layer is arranged between two adjacent pixel openings provided with light emitting layers with the same color, and the each first sub defining layer is arranged between two adjacent pixel openings provided with light emitting layers with different colors.

10. A display panel, comprising the array substrate according to claim 1.

11. A display apparatus, comprising the display panel according to claim 10.

* * * * *